(12) United States Patent
Tsukikawa

(10) Patent No.: US 6,304,496 B1
(45) Date of Patent: Oct. 16, 2001

(54) SEMICONDUCTOR MEMORY DEVICE WITH WRITE DRIVER RESET FUNCTION

(75) Inventor: Yasuhiko Tsukikawa, Hyogo (JP)

(73) Assignee: Mitsubishi Denki Kabishiki Kaisha, Tokyo (JP)

( * ) Notice: Subject to any disclaimer, the term of this patent is extended or adjusted under 35 U.S.C. 154(b) by 0 days.

(21) Appl. No.: 09/565,447

(22) Filed: May 5, 2000

(30) Foreign Application Priority Data

Oct. 5, 1999 (JP) ................................................. 11-284624

(51) Int. Cl.[7] ....................................................... G11C 5/06
(52) U.S. Cl. ........................ 365/191; 365/230.08; 365/233
(58) Field of Search ..................................... 365/191, 233, 365/205, 189.05, 230.06, 230.08

(56) References Cited

U.S. PATENT DOCUMENTS

| | | | | |
|---|---|---|---|---|
| 5,394,366 | * | 2/1995 | Miyamoto | 365/195 |
| 5,414,671 | * | 5/1995 | Fukumoto | 365/228 |
| 5,650,978 | * | 7/1997 | Ukita et al. | 365/233.5 |
| 6,072,749 | * | 6/2000 | Nakamura et al. | 365/238.5 |

FOREIGN PATENT DOCUMENTS

| | | | |
|---|---|---|---|
| 02-207354-A | * | 8/1990 | (JP) . |
| 03-078846-A | * | 4/1991 | (JP) . |
| 7-14385 | | 1/1995 | (JP) . |

\* cited by examiner

*Primary Examiner*—Richard Elms
*Assistant Examiner*—Hien Nguyen
(74) *Attorney, Agent, or Firm*—McDermott, Will & Emery

(57) ABSTRACT

In a DRAM's timing generator with a write-state signal generation circuit responding to activation of a write enable signal to activate a write-state signal and a write driver enable signal generation circuit responding to activation of the write-state signal to activate a write driver enable signal, there is provided a driver reset circuit responding to inactivation of a write enable signal to activate a driver reset signal applied to an NAND circuit downstream of a flip-flop circuit provided in a write driver enable signal generation circuit.

13 Claims, 14 Drawing Sheets

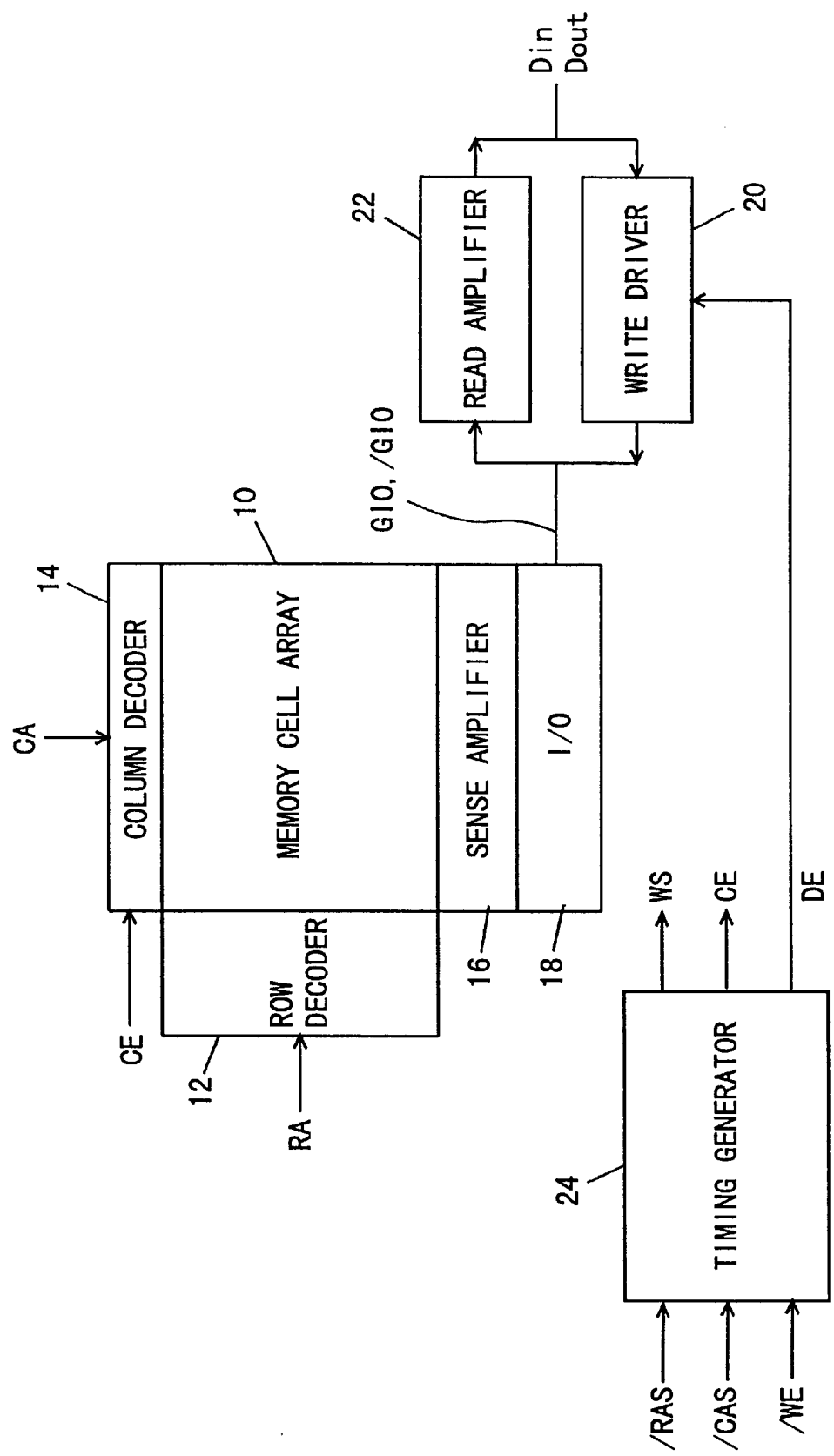
F I G. 1

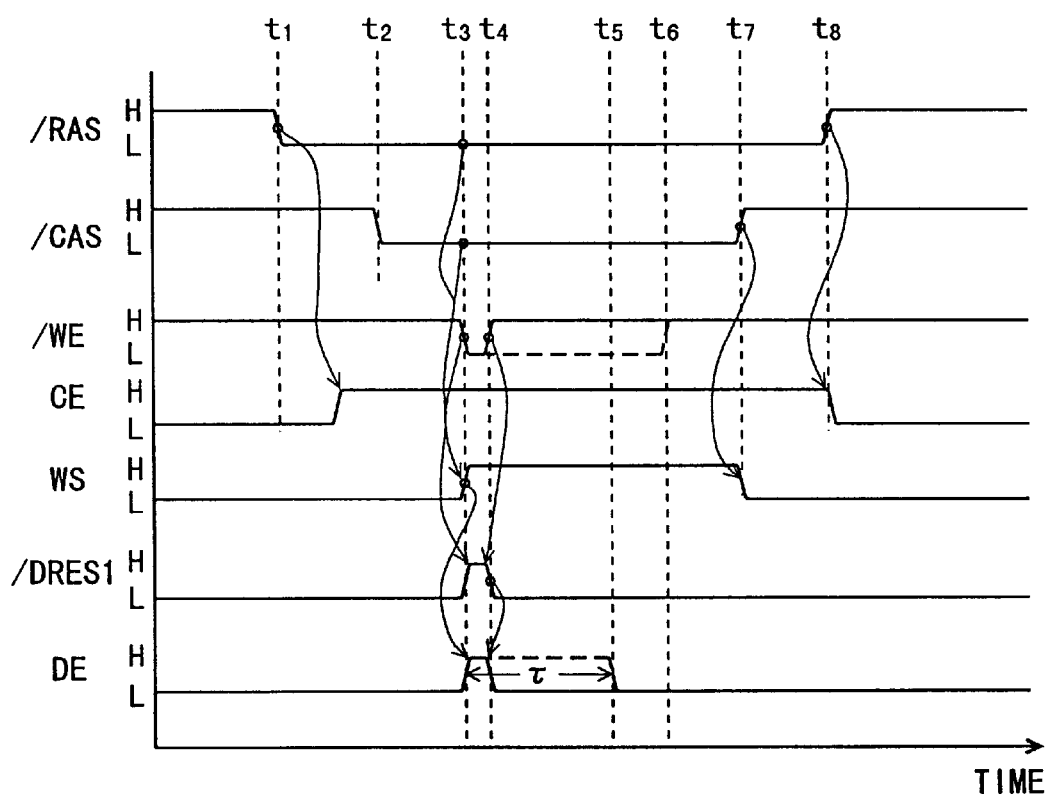
F I G. 6

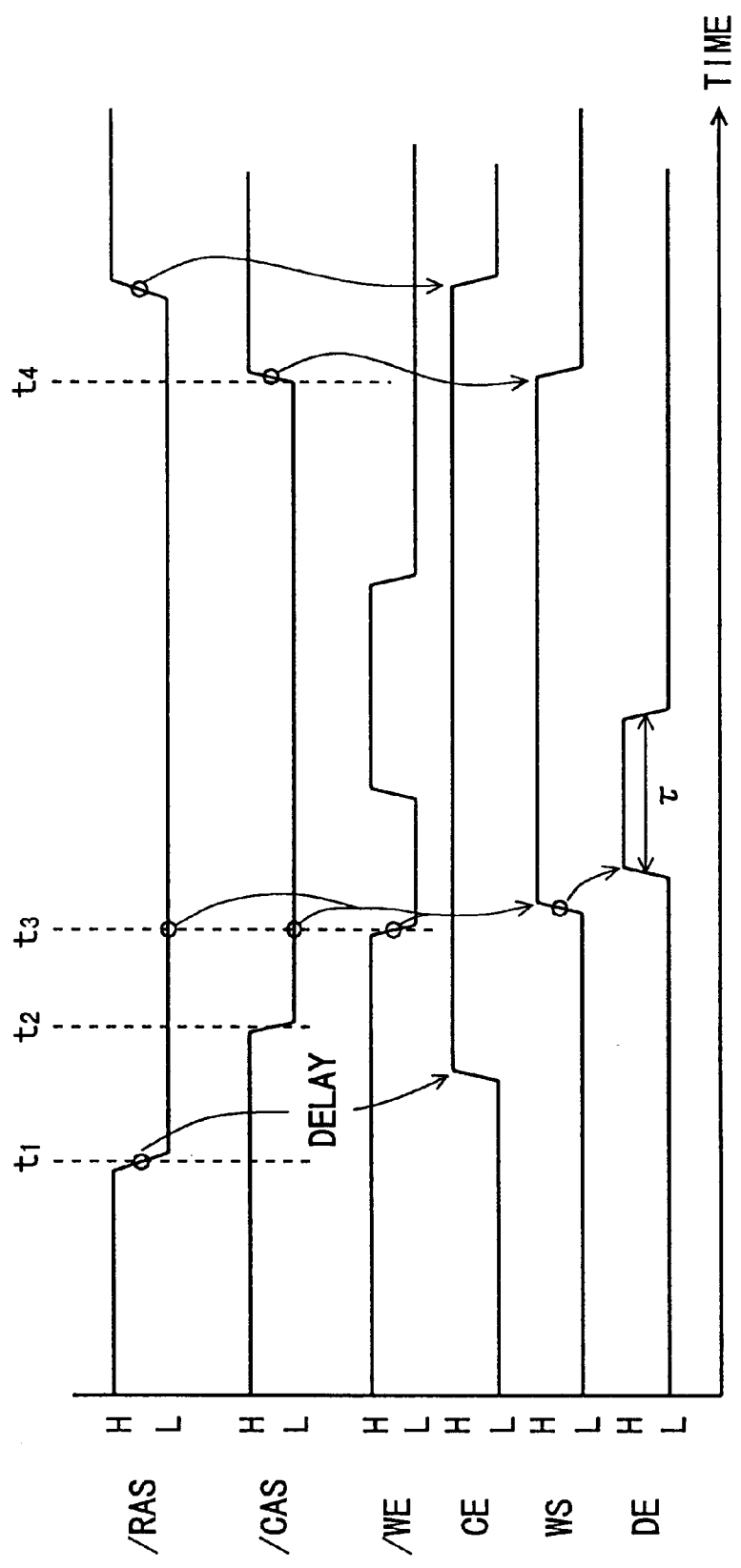

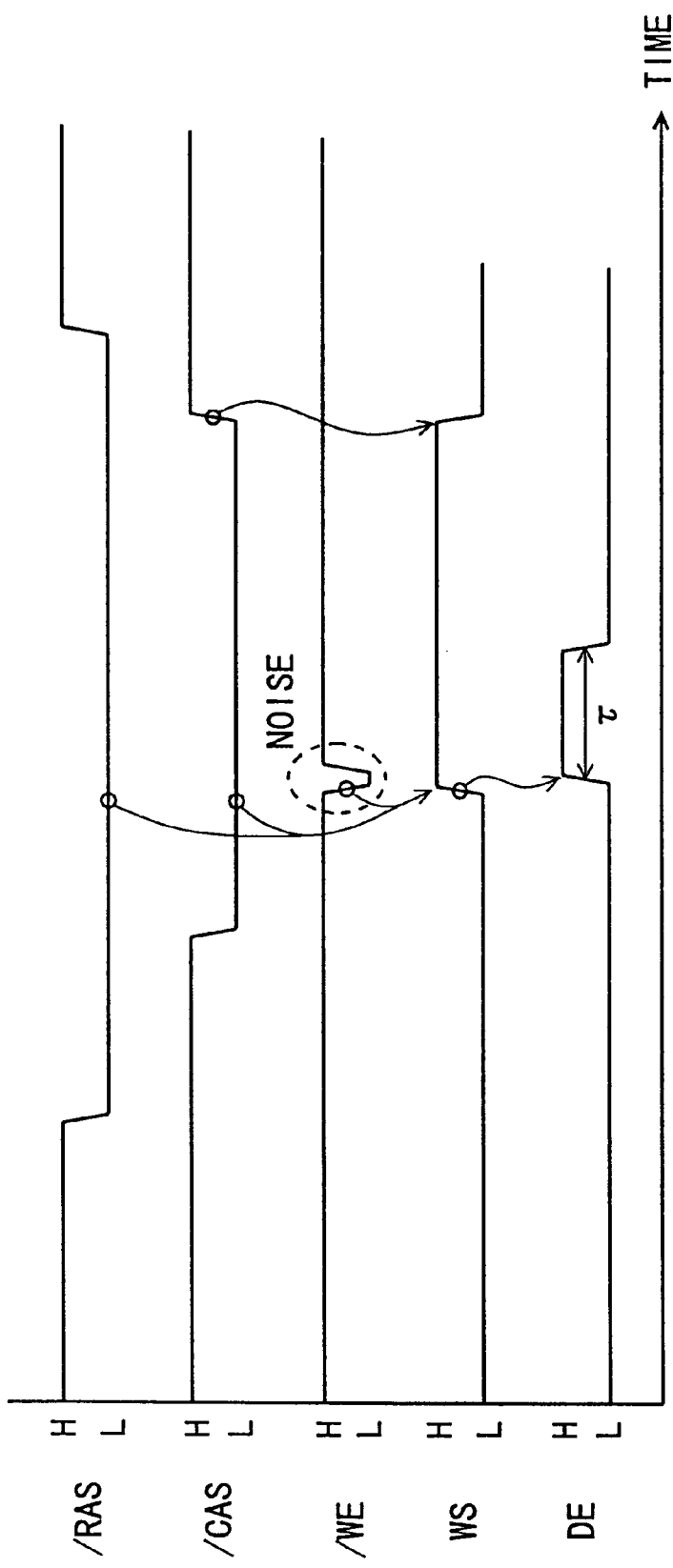

SEMICONDUCTOR MEMORY DEVICE WITH WRITE DRIVER RESET FUNCTION

BACKGROUND OF THE INVENTION

1. Field of the Invention

The present invention relates to semiconductor memory devices and particularly to semiconductor memory devices with a write driver reset circuit.

2. Description of the Background Art

Conventional semiconductor memory devices, dynamic random access memories (DRAMs) in particular, include a DRAM which operates in response to logic combinations of the control signals corresponding to externally applied row address strobe signal/RAS, column address strobe signal/CAS, write enable signal/WE, and output enable signal/OE. The DRAM includes a first-page mode DRAM (FP-DRAM), an extended-output DRAM (EDO-DRAM) and the like as representative examples. The FP-DRAM and the EDO-DRAM operate without receiving an external main clock signal. Such DRAMs recognize control signals/RAS,/CAS,/WE, and /OE input to be logical high when the control signals each have a value no less than an input logical high threshold value determined according to their specifications (referred to as a "VIHmin" hereinafter), and the DRAMs recognize control signals/RAS,/CAS,/WE and/OE to be logical low when the control signals each have a value no more than an input logical low threshold value determined according to their specifications (referred to as a "VILmax" hereinafter). The DRAM have operating states as defined by the logic combinations of the control signals. In addition to the above signals, the DRAM also has an address input (Add), a data input/output (DQ) and the like, and it is so configured that data is read and written from and to a memory cell corresponding to an address. The address signal and the data signal have their respective values VIHmin and VILmax defined as described above.

As an example, FIG. 12 represents a typical read operation of the EDO-DRAM.

At time t1, row address strobe signal/RAS transitions from high to low. Responsively, externally applied address signal Add is taken in and latched as an internal row address signal RA. Then, at time t2, column address strobe signal/CAS transitions from high to low. Responsively, externally applied address signal Add is taken in and latched as an internal column address signal CA. Row and column address signals RA and CA together specify a memory cell. From the memory cell a data signal is read and output as an output data signal Dout via a data input/output (DQ) terminal. Meanwhile, write enable signal AVE has a high level and output enable signal/OE has a low level, since write enable signal/WE having a high level at time t2 is defined to allow the DRAM's operating state to be a read state and output enable signal/OE having a low level is defined to permit a data signal to be output.

As another example, FIG. 13 represents a typical early write operation common to the FP-DRAM and the EDO-DRAM.

FIG. 13 is distinguished from FIG. 12 in that write enable signal/WE has a low level at time t2. As such, an input data signal Din externally received via the data input/output (DQ) terminal is written in a memory cell specified by row and column address signals RA and CA. Furthermore, output enable signal/OE is "Don't Care" and may have a high level or a low level. With write enable signal AVE having a low level at time t2, write operation is performed only once when column address strobe signal/CAS has a low level, and thereafter a read or write operation is never performed again. Because of such definition, write enable signal/WE is "Don't Care" from time t2 onward.

As still another example, FIG. 14 represents a typical delayed write operation common to the FP-DRAM and the EDO-DRAM.

FIG. 14 is distinguished from FIG. 13 in that write enable signal/WE at time t2 is held high, that column address strobe signal/CAS thereafter remains low, and that write enable signal/WE at time t3 transitions from high to low. As such, initially a memory cell specified by both row and column address signals RA and CA taken in at times t1 and t2 is read. It should be noted, however, that for the sake of convenience, output enable signal/OE continues to remain high. As such, in the read operation performed at time t2, data output (DQ) is not permitted, holding a high impedance state HiZ.

Then, with column address strobe signal/CAS remaining low, write enable signal/WE is driven low at time t3. Responsively, input data Din fed via the data input/output (DQ) terminal is taken in and written to a memory cell corresponding to address signals RA and CA having been taken in at times t1 and t2. This address is identical to that of the memory cell having had its data internally read at time t2.

Once a write operation has been performed at time t3, as described above, a read or write operation is never performed again as long as column address strobe signal/CAS remains low, as defined. Thus, write enable signal/WE is "Don't Care" from time t3 onwards.

The FIG. 13 early write operation and the FIG. 14 delayed write operation are summarized as below:

Step 1: when high/RAS and high/CAS transition to low/RAS, the row system is activated;

Step 2: when low/RAS, high/CAS and high/WE transition to low /RAS, low/CAS and low/WE, a write operation is performed; and Step 3: as long as low/CAS is held, a read or write operation is never performed again.

In step 2, either one of column address strobe signal/CAS and write enable signal/WE may first attain a low level. It should be noted, however, that a write operation is performed when column address strobe signal/CAS and write enable signal/WE are both set low.

To allow a DRAM to operate in such sequence, a column enable signal CE, a write-state signal WS and a write driver enable signal DE are internally generated, as shown in FIG. 15. Column enable signal CE is a signal for activating the column system, write-state signal WS is a signal indicating that the DRAM is placed in the write state, and write driver enable signal DE is a signal for activating a write driver. It should be noted that the figure represents an exemplary delayed write operation.

At time t3, row address strobe signal/RAS, column address strobe signal/CAS and write enable signal/WE are all set low. Thus, write-state signal WS is set high and the DRAM thus enters the write state. If write enable signal/WE is thereafter toggled high and low, write-state signal WS is not reset, since column address strobe signal/CAS is held low. Write-state signal WS is reset when column address strobe signal/CAS returns high, i.e., at time t4, and the DRAM thus exits from the write state.

Write driver enable signal DE goes high in response to write-state signal WE going high, and write driver enable signal DE returns low after a predetermined period of time τ elapses.

Since the conventional DRAM responds to activated write enable signal/WE to activate write-state signal WS and also responds to activated write-state signal WS to activate write driver enable signal DE for the predetermined period of time τ, write enable signal/WE that simply has a narrow noise, as shown in FIG. 16, would disadvantageously activate writes-state signal WS and write driver enable signal DE to cause the DRAM to erroneously perform a write operation.

Such noise of write enable signal/WE is caused by a slight variation in the write enable signal/WE potential that is caused in the system, a slight fluctuation in power supply or ground potential, and the like when the level of write enable signal/WE that is input as for example a high level is close to VIHmin. Since the conventional DRAM is not provided with a means for extending a margin for such noise, write enable signal/WE simply with a short, low-level pulse would set write-state signal WS, and write driver enable signal DE is responsively generated with the same pulse width τ as in the normal operation. This can result in an erroneous write operation and thus destroy data.

SUMMARY OF THE INVENTION

The present invention contemplates a semiconductor memory device with a write enable signal having a noise margin extended to prevent erroneous data write operation.

In the present invention a semiconductor memory device includes a memory cell array, a write-state signal generation circuit, a driver reset circuit, a write driver enable signal generation circuit, and a write driver. The write-state signal generation circuit activates a write-state signal in response to a write enable signal activated. The driver reset circuit activates a driver reset signal in response to the write enable signal inactivated. The write driver enable signal generation circuit activates a write driver enable signal in response to the write-state signal activated, and inactivates the write driver enable signal in response to a first driver reset signal activated. The write driver is enabled in response to the write driver enable signal and thus drives a data signal to be written to the memory cell array.

Preferably the write-state signal generation circuit includes a first flip-flop circuit latching the write-state signal.

Still preferably the write-state signal generation circuit also includes first and second logic circuits. The first logic circuit responds to a row address strobe signal, a column address strobe signal and a write enable signal that are activated, to activate a set signal for setting the first flip-flop circuit. The second logic circuit responds to the row address strobe signal or the column address strobe signal that is inactivated, to activate a reset signal for resetting the first flip-flop circuit.

Still preferably the write driver enable signal generation circuit includes a second flip-flop circuit, a one-shot circuit, a third logic circuit, a delay circuit, and a fourth logic circuit. The one-shot circuit responds to the write-state signal activated, to activate a set signal for setting the second flip-flop circuit. The third logic circuit responds to a signal output from the second flip-flop circuit and the column enable signal activated, to activate the write driver enable signal. The delay circuit delays the write driver enable signal. The fourth logic circuit responds to the write driver enable signal delayed by and output from the delay circuit that is activated, to activate a reset signal for resetting the second flip-flop circuit.

In the above semiconductor memory device, in response to the write enable signal inactivated the driver reset circuit activates the first driver reset signal. The write driver enable signal is activated in response to the write-state signal activated and the write driver enable signal is inactivated in response to the first driver reset signal activated. As such, even when the write enable signal has a noise, the first driver reset signal is activated in response to the write enable signal inactivated and the write driver is thus disabled. This prevents erroneous write operation.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a block diagram showing the entirety of a configuration of a DRAM according to a first embodiment of the present invention.

FIG. 6 is time plots representing an operation of the FIG. 5 timing generator.

FIG. 15 is time plots representing the FIG. 14 delayed write operation together with a column enable signal, a write-state signal and a write driver enable signal.

FIG. 16 is time plots representing an operation when the write enable signal has a noise in FIG. 15.

DESCRIPTION OF THE PREFERRED EMBODIMENTS

Figure 2:
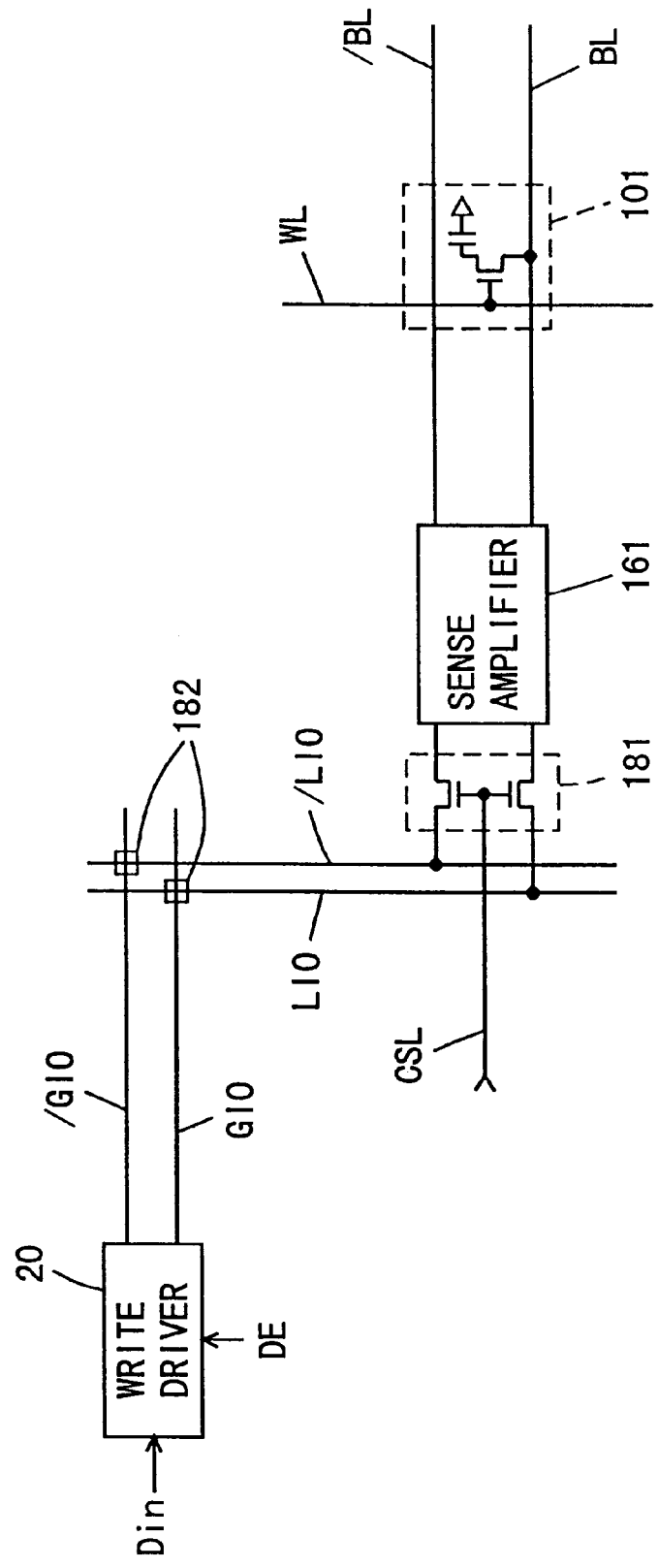
FIG. 2 is a block diagram specifically showing the FIG. 1 memory cell array, sense amplifier and input/output circuit.

The embodiments of the present invention will now be described in detail with reference to the drawings. It should be noted that in the figures, identical or corresponding components are denoted by same reference characters and a description thereof will not be repeated.

First Embodiment

Referring to FIG. 1, a DRAM according to a first embodiment of the present invention includes a memory cell array 10 having a plurality of memory cells (not shown) arranged in rows and columns, a row decoder 12 responding to a row address signal RA to select a row of memory cell array 10, a column decoder 14 responding to a column address signal CA to select a column of memory cell array 10, a sense amplifier 16 amplifying a data signal read from a memory cell, an input/output circuit 18 inputting data to be written to memory cell array 10 and outputting data read from memory cell array 10, a write driver 20 driving an input data signal Din to be written to memory cell array 10 via input/output circuit 18, a read amplifier 22 amplifying an output data signal Dout read from memory cell array 10 via input/output circuit 18, and a timing generator 24 responding to external control signals /RAS,/CAS and /WE to generate internal control signals WS, CE and DE.

As shown in FIG. 2, memory cell array 10 has a plurality of word lines WLs arranged in rows, and a plurality of pairs of bit lines BL and /BL arranged in columns. A memory cell 101 is arranged at an intersection of word line WL and the pair of bit lines BL and /BL. Each memory cell 101 is connected to word line WL associated therewith and bit line BL or /BL associated therewith. Word lines WLs are selectively driven by the FIG. 1 row decoder 12. It should be noted that FIG. 2 shows a single word line WL, a single pair of bit lines BL and /BL, and a single memory cell 101 representatively.

Furthermore, a plurality of sense amplifiers 161 are provided, associated with the plurality of pairs of bit lines BL and /BL, respectively. Each sense amplifier 161 amplifies a slight potential difference caused at the pair of bit lines BL and /BL associated therewith. Furthermore, a pair of local input/output lines LIO and /LIO is shared by the plurality of bit lines BL and /BL. Furthermore, a plurality of column select gates 181 are provided, associated with the plurality of sense amplifiers 161. Each column select gate 181 is connected between sense amplifier 161 associated therewith and the pair of local input/output lines LIO and /LIO. The plurality of column select gates 181 are connected to a plurality of column select lines CSLs, respectively. Each column select gate 181 turns on in response to a column select signal on column select line CSL associated therewith. The pair of local input/output lines LIO and /LIO is arranged parallel to a row or word line WL. Column select gate CSL is arranged parallel to a column or the pair of bit lines BL and /BL. Column select lines CSLs are selectively driven by the FIG. 1 column decoder 14. It should be noted that FIG. 2 shows a single sense amplifier 161, a single pair of local input/output lines LIO and /LIO, a single column select gate 181 and a single column select line CSL representatively.

In memory cell array 10, there are also arranged a plurality of pairs of global input/output lines GIO and /GIO. The pair of global input/output lines GIO and /GIO is arranged parallel to a column or column select line CSL. At an intersection of the pair of local input/output lines LIO and /LIO and the pair of global input/output lines GIO and /GIO there is provided a transfer gate 182 allowing a data signal to be transferred between the local input/output line pair and the global input/output line pair. The pair of global input/output lines GIO and /GIO is connected to a write driver 20 and a read preamplifier 22.

Figure 3:
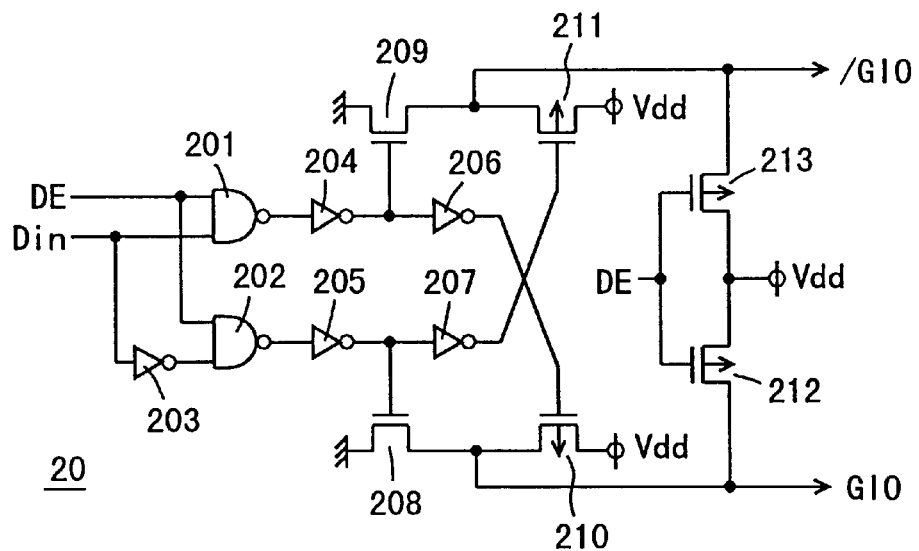
FIG. 3 is a circuit diagram showing a configuration of the write driver shown in FIGS. 1 and 2.

As shown in FIG. 3, write driver 20 includes NAND circuits 201 and 202, inverter circuits 203–207, n channel MOS transistors 208 and 209, and p channel MOS transistors 210–213.

Input data signal Din is fed to NAND circuit 201 and also fed via inverter circuit 203 to NAND circuit 202. P channel MOS transistor 212 is connected between global input/output line GIO and a power supply node, and p channel MOS transistor 213 is connected between global input/output line /GIO and a power supply node. A write driver enable signal DE is fed to NAND circuits 201 and 202 and also fed to the gates of p channel MOS transistors 212 and 213. Thus, when write driver enable signal DE has a low level, transistors 208–211 all turn off regardless of input data signal Din. Since transistors 212 and 213 turn on, the pair of global input/output lines GIO and /GIO is precharged to a power supply voltage Vdd.

When write driver enable signal DE has a high level, transistors 212 and 213 turn off and transistors 208–211 turn on/off in response to input data signal Din. Thus, in response to input data signal Din, complementary data signals are transmitted to the pair of global input/output lines GIO and /GIO.

Thus, write driver 20 is enabled in response to write enable signal DE of high level and disabled in response to write driver enable signal DE of low level.

Figure 4:
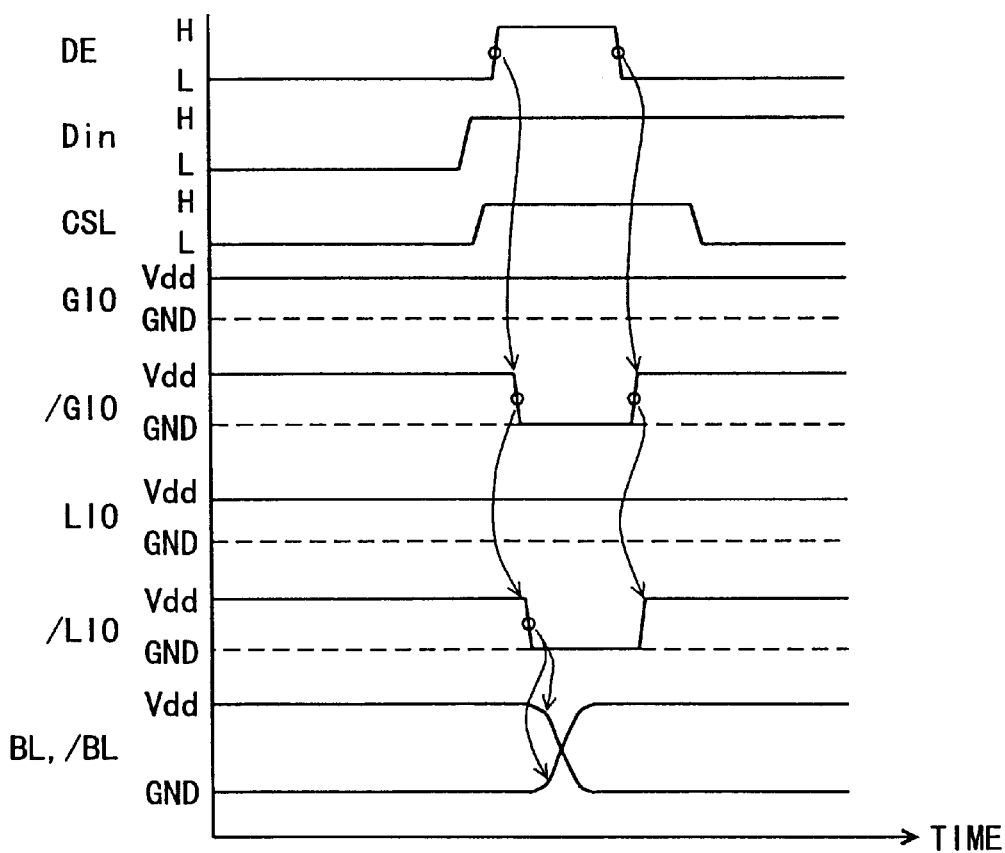
FIG. 4 is time plots representing a write operation of the DRAM shown in FIGS. 1–3.

FIG. 4 represents a write operation of the DRAM. Herein a description will be provided of an operation when input data signal Din of high level is written.

When write driver enable signal DE attains a high level, global input/output line GIO has a voltage maintained at power supply voltage Vdd while global input/output line /GIO has a voltage dropping from power supply voltage Vdd to a ground voltage GND. The pair of local input/output lines LIO and /LIO has a voltage transmitted via column select gate 181 to the pair of bit lines BL and /BL. If memory cell 101 has low-level data stored therein, sense amplifier 161 pulls the bit line BL voltage down to ground voltage GND and the bit line /BL voltage up to power supply voltage Vdd, thus latching the low-level data signal. However, since write driver 20 has a driving ability larger than sense amplifier 161, the bit line BL voltage is pulled up from ground voltage GND to power supply voltage Vdd and the bit line /BL voltage is pulled down from power supply voltage Vdd to ground voltage GND. As a result, high-level data is written to memory cell 101.

Figure 5:
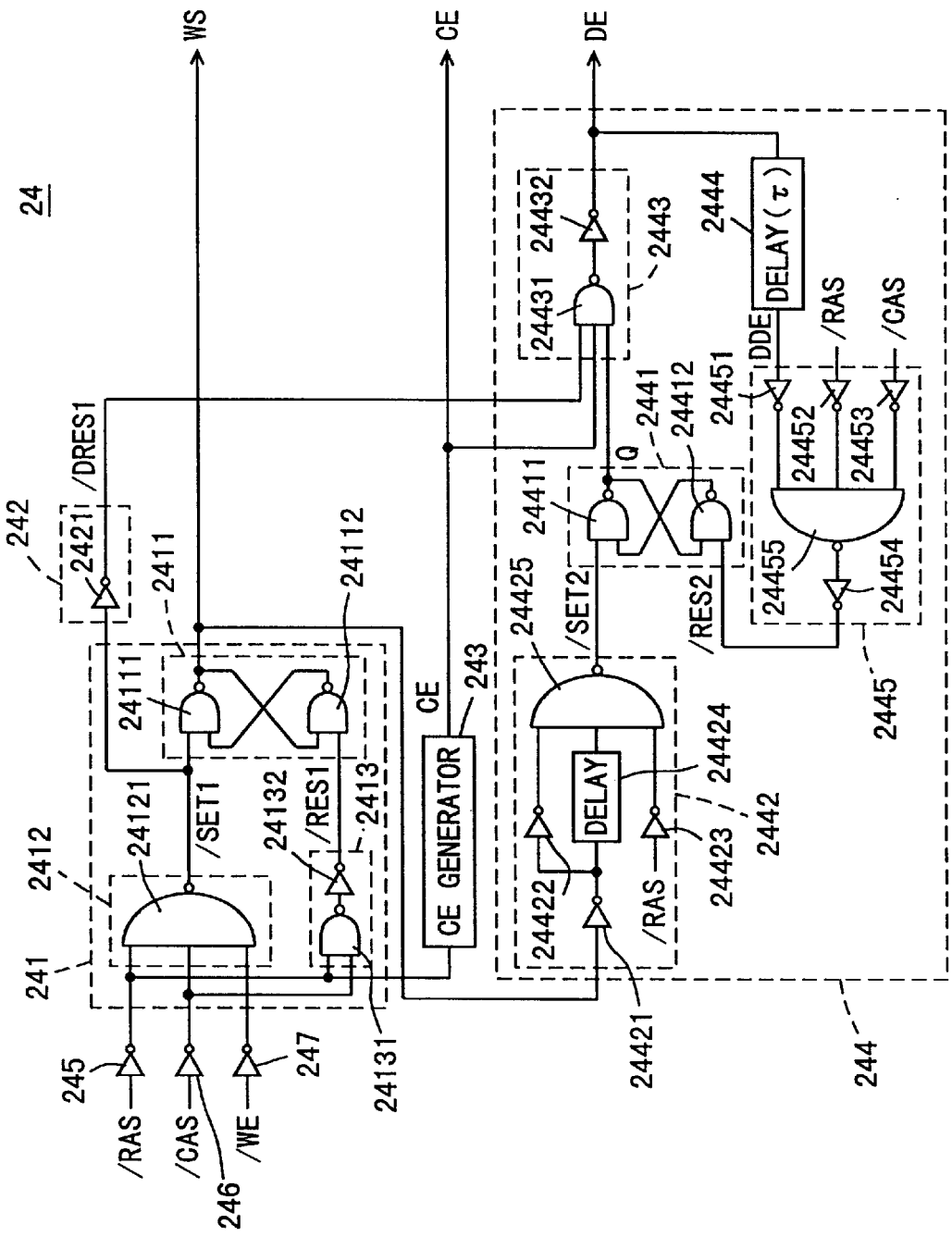
FIG. 5 is a circuit diagram showing a configuration of the FIG. 1 timing generator.

Timing generator 24 as shown in FIG. 5 includes a write-state signal generation circuit 241 responding to an activated write enable signal /WE to activate a write-state signal WS, a driver reset circuit 242 responding to inactivated write enable signal /WE to activate a driver reset signal /DRES1, a column enable signal generator 243 responding to a row address strobe signal /RAS to generate a column enable signal CE, a write driver enable signal generation circuit 244 responding to activated write-state signal WS to activate write driver enable signal DE and responding to activated driver reset signal /DRES1 to inactive write driver enable signal DE, and inverter circuits 245–247.

Write-state signal generation circuit 241 includes an RS flip-flop circuit 2411 latching write-state signal WS, a logic circuit 2412 responding to activated row address strobe signal /RAS, column address strobe signal /CAS and write enable signal /WE to activate a set signal /SET1 for setting RS flip-flop circuit 2411, and a logic circuit 2413 responding to inactivated row address strobe signal /RAS or column address strobe signal /CAS to activate a reset signal /RES1 for resetting RS flip-flop circuit 2411. RS flip-flop circuit 2411 includes NAND circuits 24111 and 24112. Logic circuit 2412 includes an NAND circuit 24121. Logic circuit 2413 includes an NAND circuit 24131 and an inverter circuit 24132.

Driver reset circuit 242 includes an inverter circuit 2421 receiving set signal/SET1 from logic circuit 2412 and outputting driver reset signal /DRES1.

Column enable signal generator 243 activates column enable signal CE following a predetermined period of time after row address strobe signal /RAS is activated, and column enable signal generator 243 inactivates column enable signal CE in response to row address strobe signal/RAS inactivated. The column system including the FIG. 1 column decoder 14 and the like is enabled in response to column enable signal CE.

Write driver enable signal generation circuit 244 includes an RS flip-flop circuit 2441, a one-shot circuit 2442 responding to activated write-state signal WS to activate a set signal/SET2 for setting RS flip-flop circuit 2441, a logic circuit 2443 responding to a signal Q from RS flip-flop circuit 2441 and activated column enable signal CE to activate write driver enable signal DE, a delay circuit 2444 delaying write driver enable signal DE by a predetermined period of time τ and a logic circuit 2445 responding to write driver enable signal DE delayed by and output from delay circuit 2444 that is activated, to activate a reset signal/RES2 for resetting RS flip-flop circuit 2441.

RS flip-flop circuit 2441 includes NAND circuits 24411 and 24412. One-shot circuit 2442 includes inverter circuits 24421–24423 and a delay circuit 24424. Logic circuit 2443 includes an NAND circuit 24431 and an inverter circuit 24432. Logic circuit 2445 includes inverter circuits 24451–24454 and an NAND circuit 24455.

Logic circuit 2443 is disabled in response to driver reset signal /DRES1.

Description will now be made of an operation of the DRAM configured as above.

As shown in FIG. 6, at time t1 row address strobe signal/RAS is activated low. After a predetermined period of time has elapsed since time t1, column enable signal generator 243 drives column enable signal CE high and thus activates column enable signal CE.

Then, when column address strobe signal/CAS at time t2 is activated low and write enable signal/WE at time t3 is also activated low, logic circuit 2412 drives set signal/SET1 low and thus activates set signal /SET1. In response to signal/SET1 of low level, flip-flop circuit 2411 is set and write-state signal WS is thus activated high. As such, the DRAM enters a write state.

When set signal/SET1 is activated low, driver reset circuit 242 also drives driver reset signal/DRES1 high and thus inactivates driver reset signal/DRES1.

When write-state signal WS is activated high, one-shot circuit 2442 activates set signal/SET2 low for a predetermined period of time. Meanwhile, row address strobe signal/RAS has a low level, and one-shot circuit 2442 responds to the low-level row address strobe signal/RAS and is thus enabled.

RS flip-flop circuit 2441 is set in response to set signal/SET2 of low level and output signal Q is thus activated high. Driver reset signal /DRES1 has been inactivated high, and logic circuit 2443, responding to the high-level driver reset signal/DRES1, has been enabled. Furthermore, column enable signal CE has also been activated high. As such, when output signal Q is activated high, logic circuit 2443 drives write driver enable signal DE high and thus activates write driver enable signal DE.

Then, when write enable signal/WE at time t4 is inactivated high, logic circuit 2412 inactivates set signal/SET1 high and driver reset circuit 242 responsively activates driver reset signal/DRES1 low. Although set signal/SET1 is inactivated high, RS flip-flop circuit 2411 latching write-state signal WS allows write-state signal WS to remain high.

When driver reset signal/DRES1 is activated low, logic circuit 2443 responds to the low-level driver reset signal/DRES1 and thus disabled. Thus, write driver enable signal DE is inactivated low.

A conventional timing generator does not have such driver reset circuit 242 as described above. As such, if write enable signal WE has a noise with a reduced pulse width and write enable signal/WE is activated low and immediately thereafter inactivated high, write driver enable signal DE remains high as long as RS flip-flop circuit 2441 is set. Following the prdetermined period of time r after time t3, i.e., at time t5, logic circuit 2445 activates reset signal/RES2 low and RS flip-flop circuit 2441 is reset in response to the low-level/RES2. Thus, write driver enable signal DE is inactivated low. As such, write enable signal/WE simply with a noise introduced therein conventionally, disadvantageously activates write driver enable signal DE high and thus results in an erroneous write operation.

In the first embodiment of the present invention, in contrast, when write enable signal/WE is inactivated, driver reset signal/DRES1 is responsively activated, and when driver reset signal/DRES1 is activated, write driver enable signal DE is responsively inactivated. As such, write enable signal/WE that is simply noisy hardly enables write driver 20 and thus does not result in erroneous write operation.

It should be noted that if write enable signal/WE remains low until a time later than time t5, i.e., time t6, driver reset signal/DRES1 is not activated low and write driver enable signal DE is thus activated high for the predetermined period of time τ, as normal.

Then, when column address strobe signal/CAS at time t7 is inactivated high, logic circuit 2413 activates reset signal/RES1 low. In response to the low-level reset signal/RES1, RS flip-flop circuit 2441 is reset and write-state signal WS is thus inactivated low.

Finally, when row address strobe signal/RAS at time t8 is inactivated high, column enable signal generator 243 inactivates column enable signal CE low.

As described above, in the first embodiment, driver reset circuit 242 activates driver reset signal/DRES1 in response to write enable signal/WE inactivated, and logic circuit 2443 generating write driver enable signal DE is disabled in response to driver reset signal/DRES1. As such, write enable signal/WE has an extended noise margin and if write enable signal/WE is slightly noisy it does not result in erroneous write operation.

Second Embodiment

Figure 7:
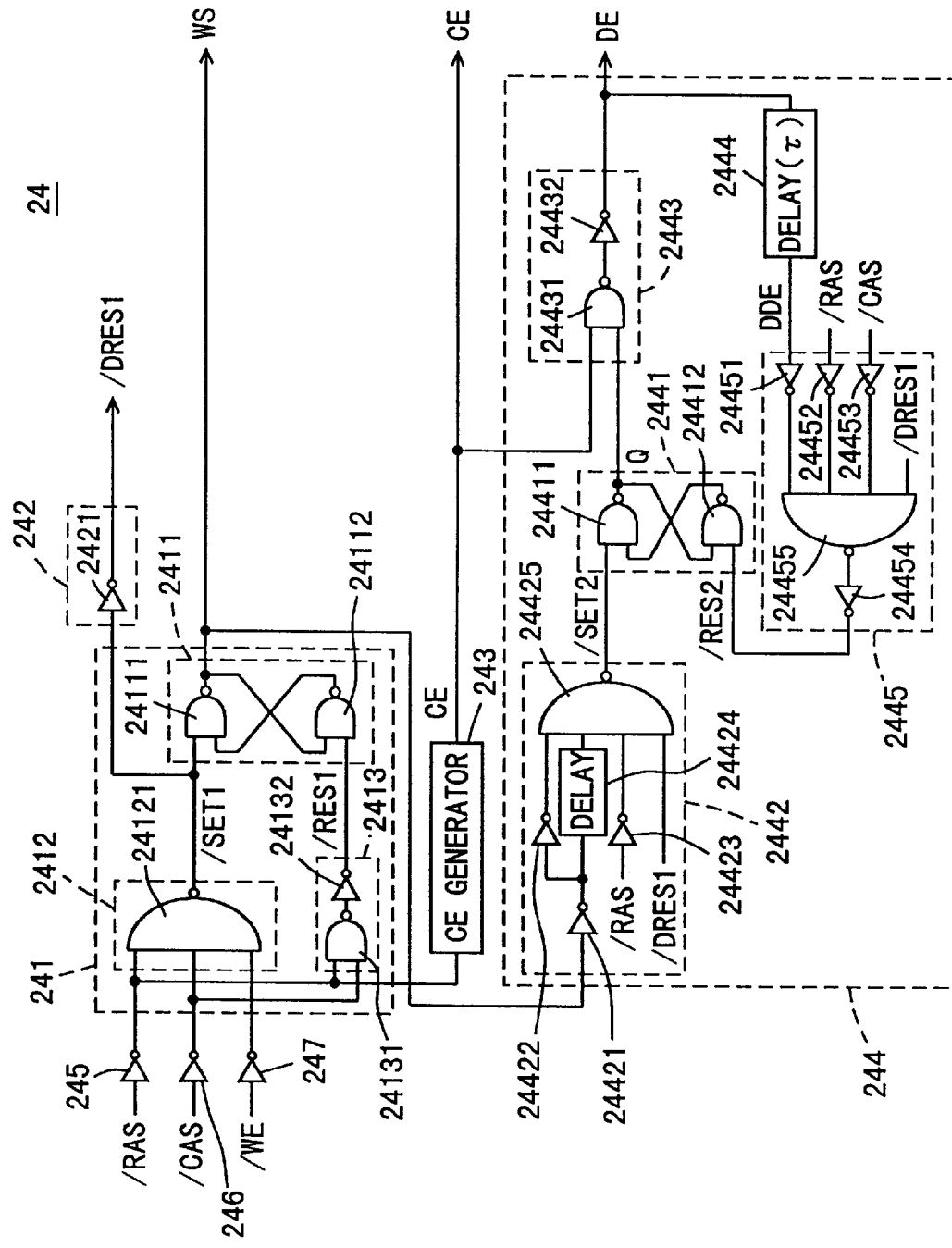
FIG. 7 is a circuit diagram showing a configuration of a timing generator provided in a DRAM according to a second embodiment of the present invention.

The FIG. 5 timing generator 24 may be replaced by the FIG. 7 timing generator 24. While in the first embodiment driver reset signal/DRES1 is fed to NAND circuit 24431 provided in logic circuit 2443, in the second embodiment it is fed to an NAND circuit 24425 provided in a one-shot circuit 2442 and also to an NAND circuit 24455 provided in a logic circuit 2445. Thus, one-shot circuit 2442 and logic circuit 2445 are disabled in response to driver reset signal/DRES1.

Timing generator 24 configured as above operates as shown in the FIG. 6 timing plots, although when write enable signal/WE at time t4 is inactivated high and driver reset signal/DRES1 is responsively activated low, NAND circuit 24425 in one-shot circuit 2442 inactivates set signal /SET2 high and NAND circuit 24455 in logic circuit 2445 simultaneously activates reset signal /RES2 low. In response to the low-level reset signal /RES2, RS flip-flop circuit 2441 is reset and output signal Q is thus inactivated low. Thus, logic circuit 2443 inactivates write driver enable signal DE low.

Thus the second embodiment is as effective as the first embodiment.

Third Embodiment

Figure 8:
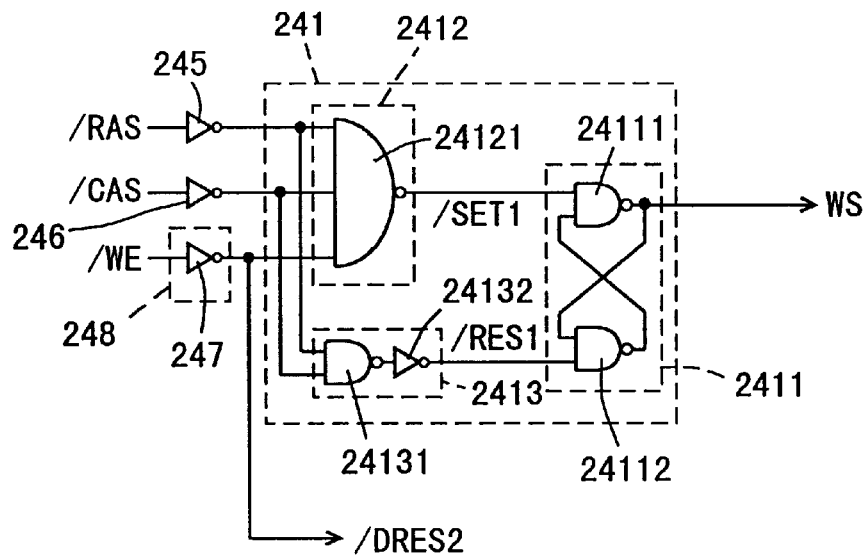
FIG. 8 is a circuit diagram showing a configuration of a write-state signal generation circuit and a driver reset circuit of a timing generator in a DRAM according to a third embodiment of the present invention.

Driver reset circuit 242 provided as in the first and second embodiments may be replaced by an inverter circuit 247 used as a driver reset circuit 248, as shown in FIG. 8. In the present embodiment, driver reset circuit 248 includes an inverter circuit 247 receiving write enable signal/WE and outputting a driver reset signal/DRES2.

In the third embodiment, driver reset signal/DRES2 replaces the FIG. 5 driver reset signal/DRES1 and is fed to an NAND circuit 24431 provided in logic circuit 2443, and logic circuit 2443 is disabled in response to driver reset signal/DRES2.

Alternatively, driver reset signal/DRES2 replaces the FIG. 7 driver reset signal/DRES1 and is fed to an NAND circuit 24425 in a one-shot circuit 2442 and also to an NAND circuit 24455 in logic circuit 2445, and one-shot circuit 2442 and logic circuit 2445 are disabled in response to driver reset signal/DRES2.

The timing generator thus configured operates as represented in the FIG. 6 timing plots.

Thus the third embodiment is as effective as the first and second embodiments.

Fourth Embodiment

In general, data in a DRAM's memory cell is destroyed when the column system starts to operate after activation of row address strobe signal /RAS and before completion of sense amplifier operation. Accordingly, the column system is enabled in response to a column enable signal activated after sense amplifier operation completes. However, when a write enable signal is inactivated before the column enable signal is activated, driver reset signals DRES1 and DRES2, as in the first to third embodiments, can fail to activate write driver enable signal DE and an erroneous operation can occur, preventing necessary data from being written. The fourth embodiment is provided to overcome such disadvantage and contemplates prohibiting a driver from being reset before the column enable signal is activated.

Figure 9:
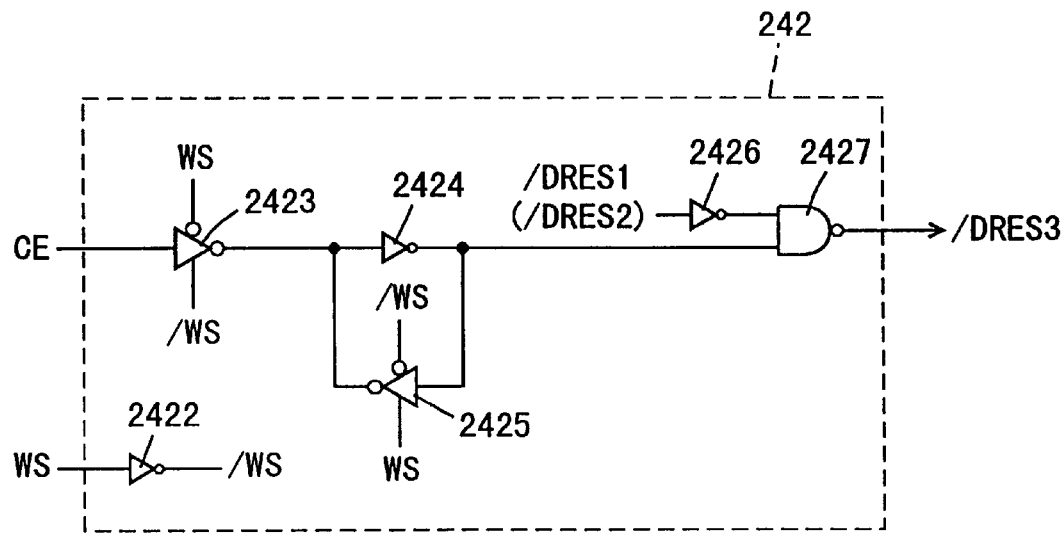
FIG. 9 is a circuit diagram showing a configuration of a driver reset circuit provided in a timing generator of a DRAM according to a fourth embodiment of the present invention.

As shown in FIG. 9, a driver reset circuit 242 includes the FIG. 5 inverter circuit 2421 plus inverter circuits 2422–2426 and an NAND circuit 2427. Inverter circuit 2422 receives write-state signal WS and outputs an inverted write-state signal/WS. Inverters 2423 and 2425 are enabled in response to write-state signal WS inverted write-state signal/WS. Column enable signal CE is fed to NAND circuit 2427 via inverters 2423 and 2424. Inverter 2421 outputs driver reset signal/DRES1 which is in turn fed via inverter 2426 to NAND circuit 2427. Thus, NAND circuit 2427 activates a driver reset signal/DRES3 in response to column enable signal CE and driver reset signal/DRES1 activated. In place of the FIG. 5 driver reset signal/DRES1, driver reset signal/DRES3 is fed to NAND circuit 24431 provided in logic circuit 2443. Thus, logic circuit 2443 is disabled in response to driver reset signal/DRES3.

Alternatively, in place of driver reset signal/DRES1 the FIG. 8 driver reset signal/DRES2 may be fed via inverter 2426 to NAND circuit 2427. In this arrangement, the driver reset circuit includes the FIG. 8 inverter circuit 247 plus the FIG. 9 circuit 242.

Initially a normal operation will now be described with column enable signal CE first activated and write enable signal/WE then activated.

Figure 10:
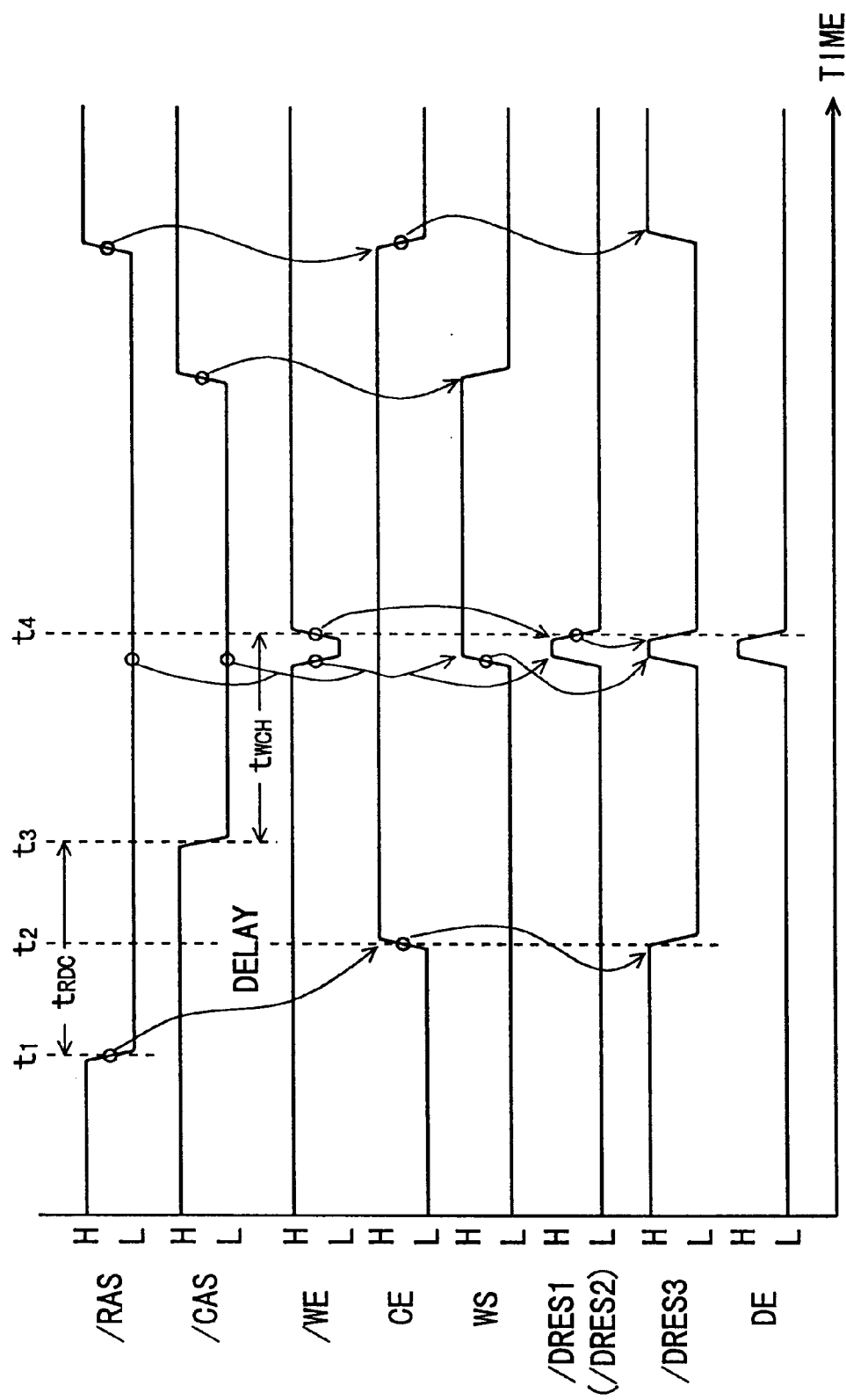
FIG. 10 is time plots representing an operation when a write enable signal is activated after column enable, with the FIG. 9 driver reset circuit used.

As shown in FIG. 10, when row address strobe signal/ RAS at time t1 is activated low and following a predetermined period of time thereafter, i.e., at time t2 column enable signal CE is activated high, driver reset signal /DRES3 is activated low since driver reset signal/DRES1 (or/DRES2) has been set low. From time t2 onwards, the operation of the present embodiment is similar to those of the first to third embodiments.

According to a DRAM's timing specification, a/RAS-/ CAS delay time $t_{RCD}$ of 14 ns is specified for time t1 to time t3 and a Write Hold After/CAS time $t_{WCH}$ of 8 ns is specified for time t3 to time t4. Thus, the specification allows a shortest time ($t_{RCD}+t_{WCH}$) of up to 22 ns for time t1 to time t4. Normally, after row address strobe signal/RAS is activated at time t1 a time period of approximately 25 ns elapses and then at time t2 column enable signal CE is activated. As such, before column enable signal CE is activated, write enable signal/WE can be activated and inactivated, as shown in FIG. 11.

Figure 11:
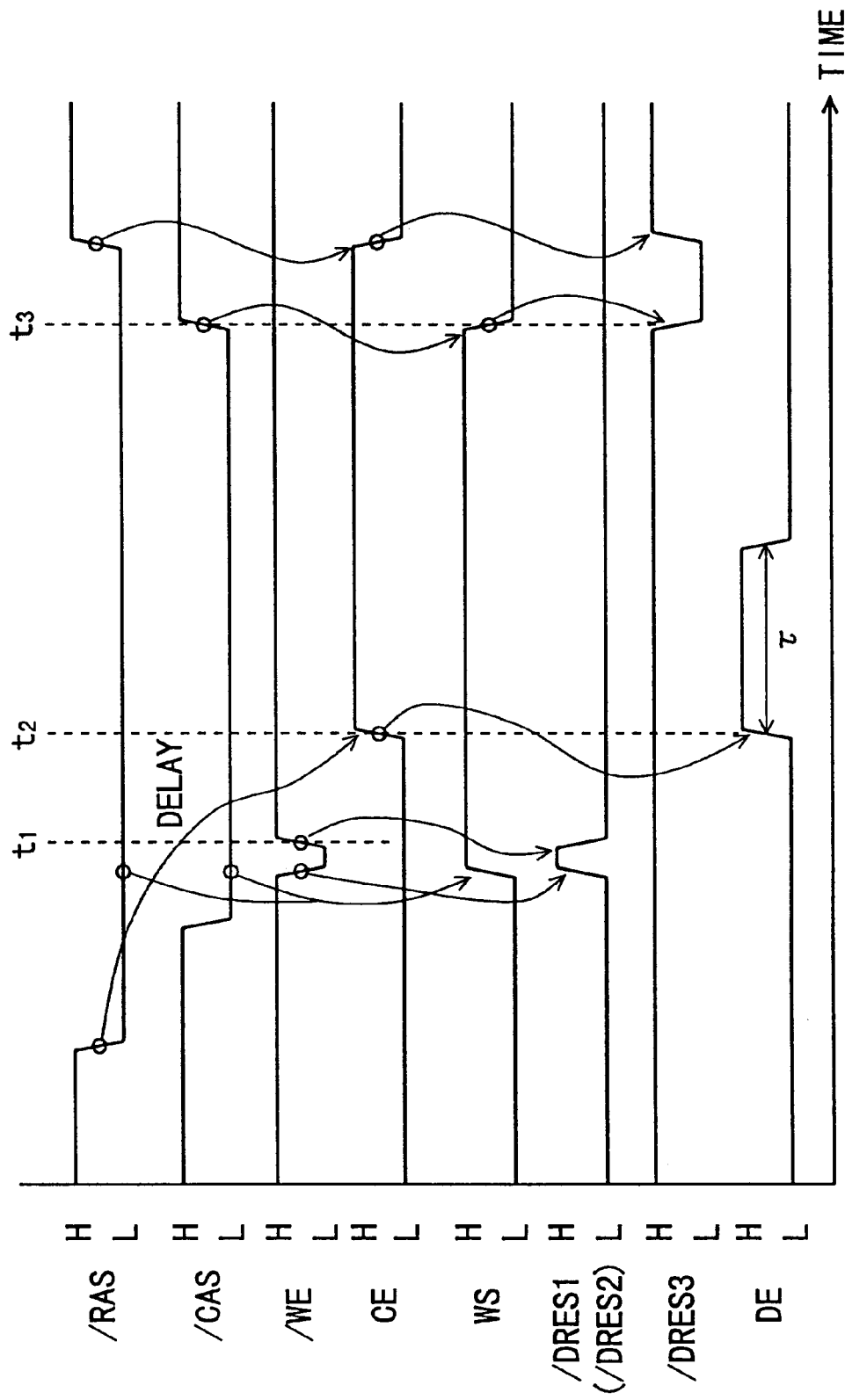
FIG. 11 is time plots representing an operation when the write enable signal is activated before column enable, with the FIG. 9 driver reset circuit used.
Figure 12:
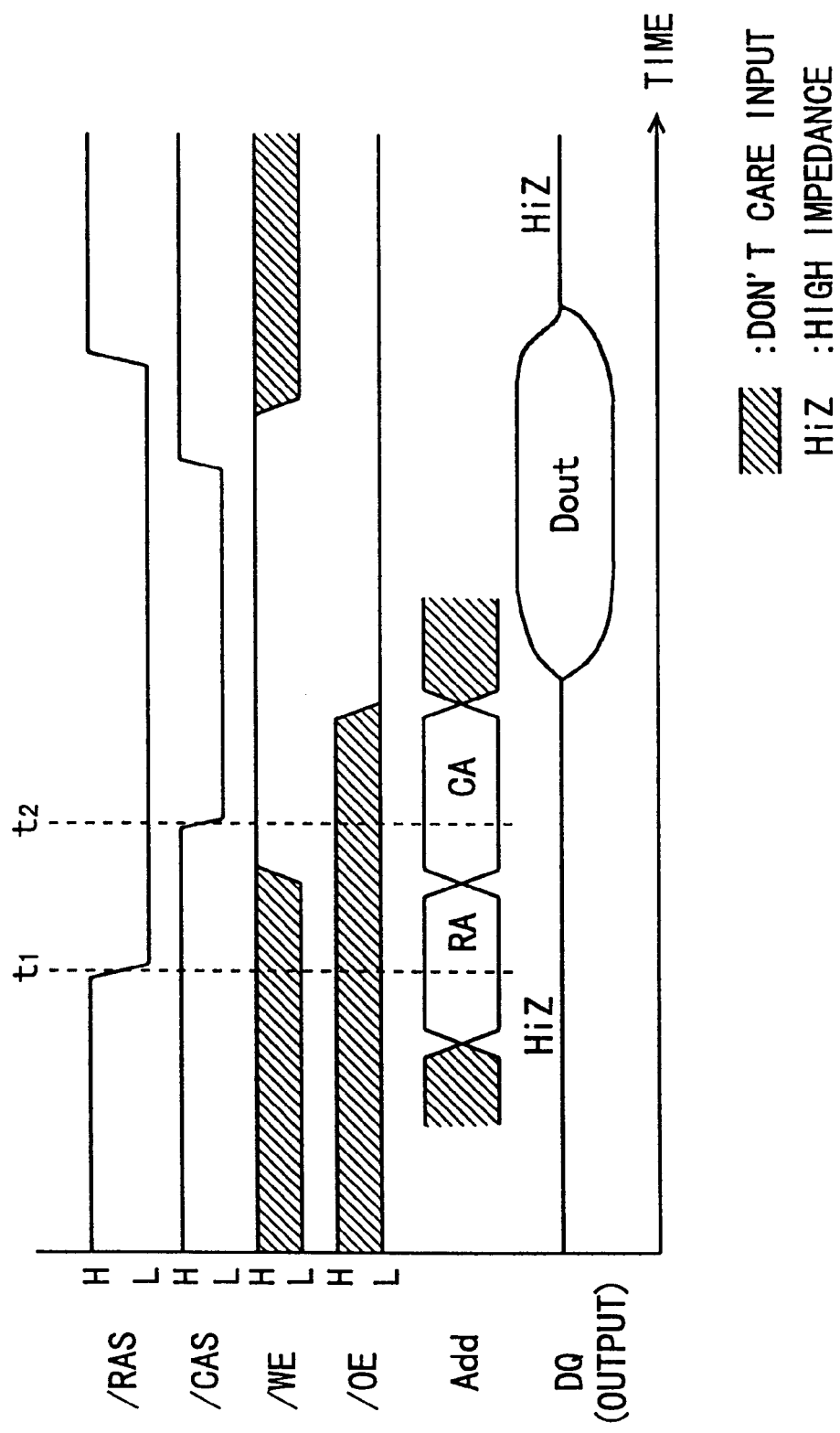
FIG. 12 is time plots representing a read operation of an EDO-DRAM.
Figure 13:
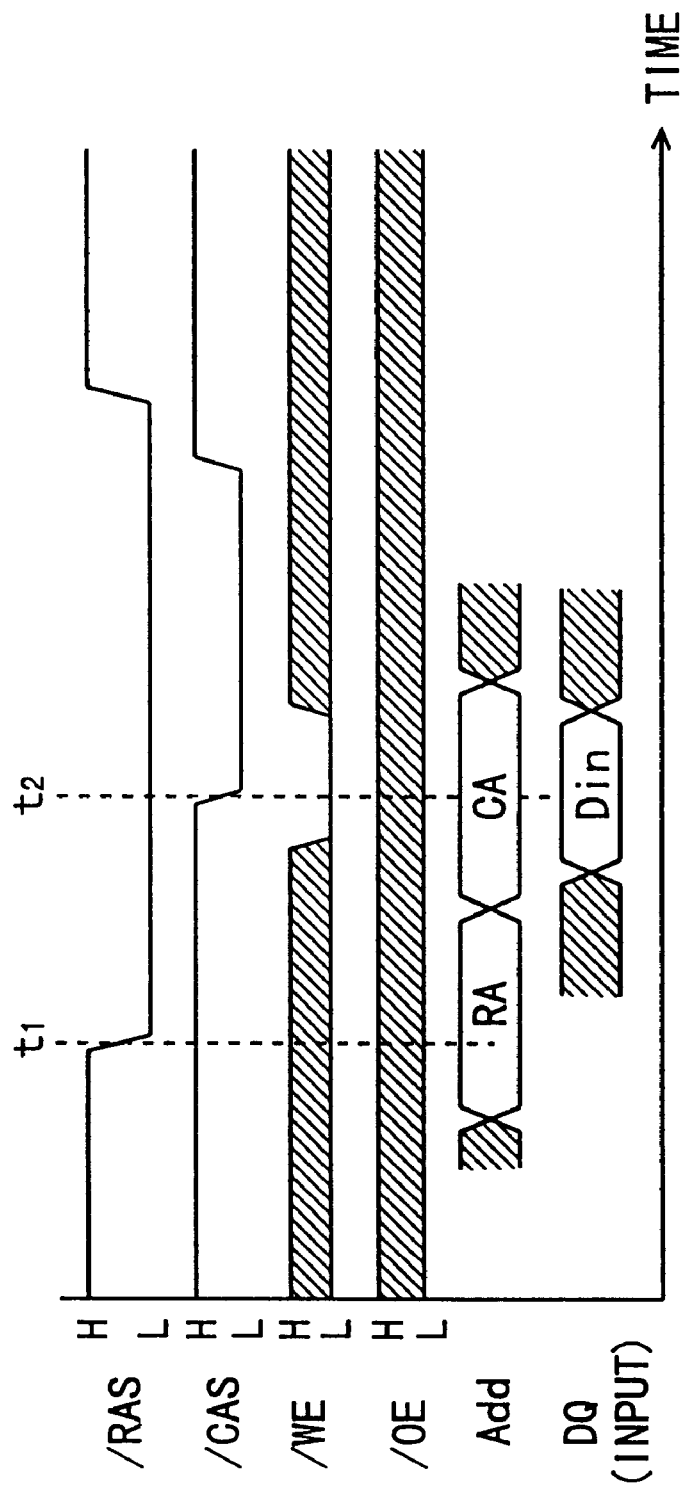
FIG. 13 is time plots representing an early write operation common to an FP-DRAM and an EDO-DRAM.
Figure 14:
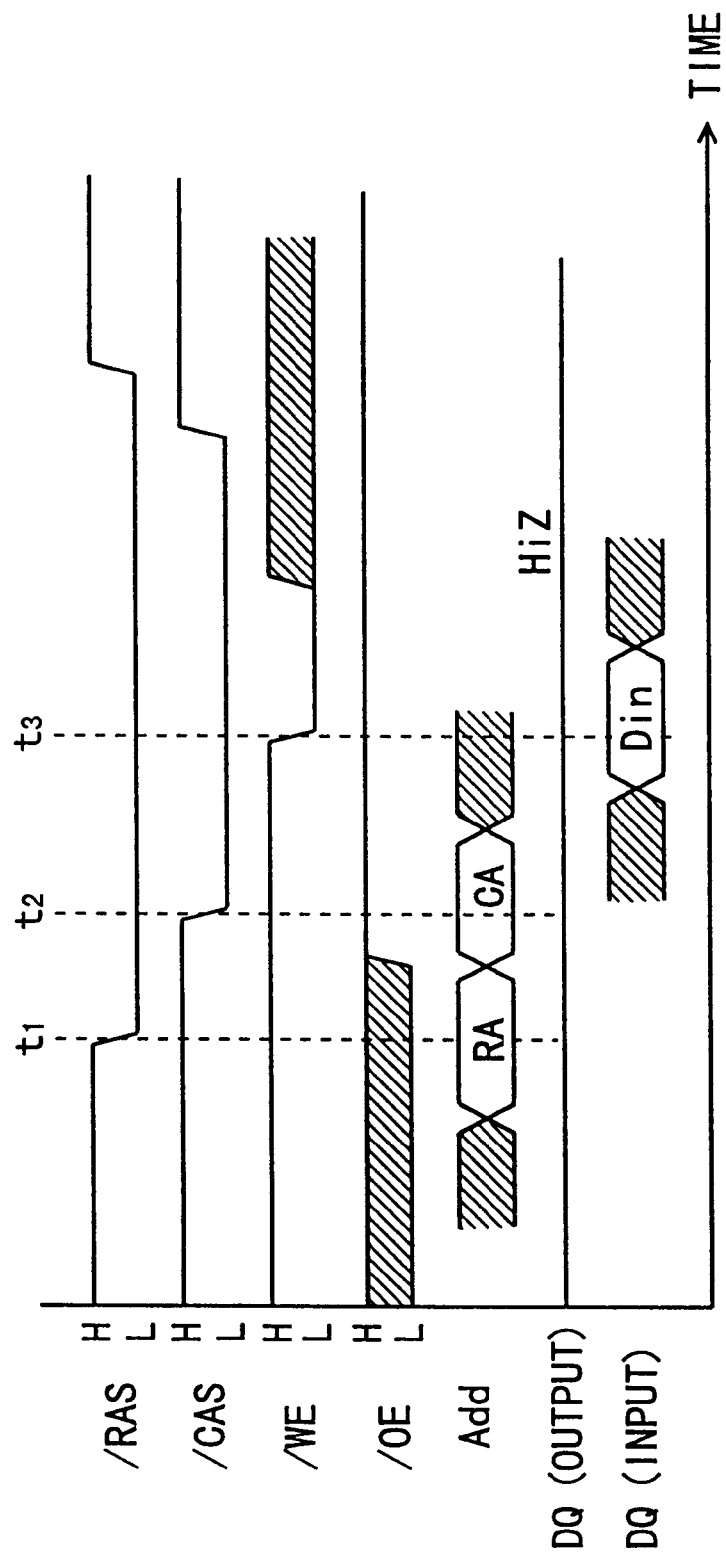
FIG. 14 is time plots representing a delayed write operation common to an FP-DRAM and an EDO-DRAM.

As shown in FIG. 11, while before column enable signal CE is activated, or at time t1, write enable signal/WE returns high, driver reset signal/DRES3 is not activated low since column enable signal CE is not active, and the latch circuit configured by inverters 2424 and 2425 latches and feeds a low-level signal to NAND circuit 2427.

Then, while at time t2 column enable signal CE is activated high, the latch circuit (2424, 2425) continues to feed the low-level signal to NAND circuit 2427 since inverter circuit 2423 is not enabled. Thus, driver reset signal/DRES3 is still not activated low.

Then, when column address strobe signal/CAS at time t3 is inactivated high, write-state signal WS is inactivated low and thus inverter 2423 is enabled and inverter 2425 is disabled. Thus, column enable signal CE of high level is fed via inverters 2423 and 2424 to NAND circuit 2427. Since driver reset signal/DRES1 (or/DRES2) has been activated low by time t3, at time t3 driver reset signal/DRES3 is activated low.

Thus the fourth embodiment includes NAND circuit 2427 prohibiting driver reset signal/DRES3 from being activated before column enable signal CE is activated. As such, write operation is properly performed if write enable signal/WE is activated and inactivated before column enable signal CE is activated.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a memory cell array;
   a write-state signal generation circuit responding to activation of a write enable signal to activate a write-state signal;
   a driver reset circuit responding to inactivation of said write enable signal to activate a driver reset signal;
   a write driver enable signal generation circuit responding to activation of said write-state signal to activate a write driver enable signal and responding to activation of said driver reset signal to inactivate said write driver enable signal; and a write driver responding to said write driver enable signal to be enabled to drive a data signal to be written to said memory cell array.

2. The semiconductor memory device according to claim 1, wherein said write-state signal generation circuit includes a first flip-flop circuit latching said write-state signal.

3. The semiconductor memory device according to claim 2, wherein said write-state signal generation circuit further includes:

a first logic circuit responding to activation of a row address strobe signal, of a column address strobe signal and of said write enable signal to activate a set signal for setting said first flip-flop circuit; and a second logic circuit responding to inactivation of said row address strobe signal or of said column address strobe signal to activate a reset signal for resetting said first flip-flop circuit.

4. The semiconductor memory device according to claim 3, wherein said write driver enable signal generation circuit includes:

a second flip-flop circuit;

a one-shot circuit responding to activation of said write-state signal to activate a set signal for setting said second flip-flop circuit;

a third logic circuit responding to a signal output from said second flip-flop circuit and to activation of a column enable signal to activate said write driver enable signal;

a delay circuit delaying said write driver enable signal; and a fourth logic circuit responding to activation of said write driver enable signal delayed by said delay circuit to activate a reset signal for resetting said second flip-flop circuit.

5. The semiconductor memory device according to claim 4, wherein said driver reset circuit includes an inverter circuit receiving said set signal from said first logic circuit and outputting said driver reset signal.

6. The semiconductor memory device according to claim 5, wherein said third logic circuit is disabled in response to said driver reset signal.

7. The semiconductor memory device according to claim 5, wherein said one-shot circuit and said fourth logic circuit are disabled in response to said driver reset signal.

8. The semiconductor memory device according to claim 4, wherein said driver reset circuit includes an inverter circuit receiving said write enable signal and outputting said driver reset signal.

9. The semiconductor memory device according to claim 8, wherein said third logic circuit is disabled in response to said driver reset signal.

10. The semiconductor memory device according to claim 8, wherein said one-shot circuit and said fourth logic circuit are disabled in response to said driver reset signal.

11. The semiconductor memory device according to claim 4, wherein:

said driver reset circuit includes a logic circuit responding to activation of said column enable signal to activate said driver reset signal; and said third logic circuit is disabled in response to said second driver reset signal.

12. The semiconductor memory device according to claim 11, wherein said driver reset circuit includes an inverter circuit receiving said set signal from said first logic circuit and outputting said driver reset signal.

13. The semiconductor memory device according to claim 11, wherein said driver reset circuit includes an inverter circuit receiving said write enable signal and outputting said driver reset signal.

* * * * *